(12) United States Patent
Zappacosta, II

(10) Patent No.: US 6,252,787 B1
(45) Date of Patent: Jun. 26, 2001

(54) CONTROLLABLE CIRCUIT FOR PROVIDING BI-DIRECTIONAL CURRENT TO A LOAD

(75) Inventor: Ernest E. Zappacosta, II, Tucson, AZ (US)

(73) Assignee: Honeywell International Inc., Morris Township, NJ (US)

( * ) Notice: Subject to any disclaimer, the term of this patent is extended or adjusted under 35 U.S.C. 154(b) by 0 days.

(21) Appl. No.: 09/569,561

(22) Filed: May 12, 2000

(51) Int. Cl.[7] .................................................. H02M 7/217
(52) U.S. Cl. .............................. 363/89; 363/68; 363/21.04
(58) Field of Search .................................. 363/81, 84, 89, 363/67, 68, 20, 21.01, 21.04, 125

(56) References Cited

U.S. PATENT DOCUMENTS

| | | | |
|---|---|---|---|
| 4,150,413 | * | 4/1979 | Nerem . |
| 4,438,411 | * | 3/1984 | Rubin et al. . |
| 4,471,289 | * | 9/1984 | Duley et al. . |
| 4,520,296 | * | 5/1985 | Lepper et al. . |
| 4,562,522 | * | 12/1985 | Adams et al. . |
| 4,593,213 | * | 6/1986 | Vesce et al. . |
| 4,710,686 | * | 12/1987 | Guzik . |
| 4,827,366 | * | 5/1989 | McNally et al. . |
| 4,881,014 | * | 11/1989 | Okochi . |
| 5,267,137 | * | 11/1993 | Goebel .................................. 363/87 |
| 5,317,254 | * | 5/1994 | Olson . |
| 5,398,182 | * | 3/1995 | Crosby .................................. 363/89 |
| 5,552,685 | * | 9/1996 | Young et al. . |
| 5,886,889 | * | 3/1999 | Escallier ................................ 363/69 |

\* cited by examiner

*Primary Examiner*—Adolf Deneke Berhane
(74) *Attorney, Agent, or Firm*—Keith Newburry, Esq.

(57) ABSTRACT

A bi-directional current circuit disposed between two power sources and a load. A first switch and a second switch each connect the load to one of the power sources respectively, whereby when the first switch is closed and the second switch is open current flows to the load in a first direction and when the first switch is open and the second switch is closed current flows to the load in a second direction opposite to the first direction.

26 Claims, 2 Drawing Sheets

CONTROLLABLE CIRCUIT FOR PROVIDING BI-DIRECTIONAL CURRENT TO A LOAD

TECHNICAL FIELD

This invention relates to bi-directional current circuits.

BACKGROUND OF THE INVENTION

Airplanes often have an on-board gas turbine engine referred to as an auxiliary power unit that provides electrical power and compressed air to various systems throughout the airplane. When the airplane is on the ground, the auxiliary power unit is the main source of power to drive the environmental control systems, air driven hydraulic pumps, and the starters for the engines. Auxiliary power units may also provide pneumatic and electric power during flight.

FIG. 1 shows a typical Auxiliary Power Unit (APU) generally denoted by the reference numeral 10. The APU 10 includes in flow series arrangement an air inlet 14, a compressor 16, a bleed port 18 for providing compressed air to the aircraft, a combustor 20 having a primary fuel nozzle 22 and a secondary fuel nozzle 24, a turbine 26 and a gas exhaust 28. Of the two nozzles 22 and 24, only the primary nozzle 22 operates during the initial stages of a startup. The compressor 16 and the turbine 26 are mounted for rotation on a shaft 30 which extends to a gearbox 32.

Mounted to the gearbox 32 is a fuel control unit 40 in fluid communication with a fuel source, (not shown), aboard the aircraft. Preferably, the fuel control unit 40 is a single stage, electromechanical fuel metering valve of the type which is well known in the art. The fuel control unit 40 includes an electrically operated torque motor 42 which has a known and repeatable relationship with a power signal from an electronic control unit (ECU) 80 which may be analog or digital. The motor 42 is directly coupled to a metering valve, not shown, and controls the valve position so that a known flow area in the metering valve corresponds to a known power signal from the ECU 80. The ECU 80 communicates with the torque motor 42 through a bi-directional circuit such as an H-bridge, and commands the motor 42 to open the valve, when an increase in fuel flow is needed, and to close the valve when a decrease in fuel is required. The ECU 80 also controls the speed at which the torque motor opens and closes the valve. From the fuel control unit 40 metered fuel flows through a conduit 46 to a flow divider 50. From the flow divider 50 the stream of fuel splits with a portion flowing through a conduit 52 which leads to the primary fuel nozzle 22 and the remainder through a conduit 54 to a secondary fuel nozzle 24.

One type of bi-directional circuit used between the ECU 80 and the torque motor 42 is the conventional H-bridge. This configuration typically uses one power supply and four power switches (i.e. power transistors) to produce the desired current flow through a load. The load is the device to which power is delivered, (i.e. the torque motor 42). It can be resistive, or inductive. The advantage of the H-bridge configuration is that it uses a single power source (i.e. the ECU 80). Referring to FIG. 2, the current to the load is controlled by means of the four power switches. During one half cycle, current flows from switch A through the load to switch D. During the other half cycle, current flows from switch B through the load to switch C.

There are, however, several disadvantages to using an H-bridge. The H-bridge requires four power switching devices for each load. Since power switching devices are usually the most expensive components of a driver, these types of switches drive up the cost of the ECU 80 in which they are mounted. There is also a size limitation. With four power switching devices, the power driver might grow beyond the size limitations of the overall design. Another disadvantage is that during any half cycle power is always being dissipated in two power switching devices, either A and D or B and C.

Accordingly, there is a need for bi-directional current circuit that has fewer switches and thus takes up less board area, costs less, dissipates less power and has fewer parts than an H-bridge.

SUMMARY OF THE INVENTION

An object of the present invention is to provide an improved bi-directional current circuit.

The present invention meets this objective by providing a bi-directional current circuit disposed between two power sources and a load. First and second switches are arranged in series with the load and connect the load to one of the power sources, whereby when said first switch is closed and said second switch is open current flows to the load in a first direction and when said first switch is open and said second switch is closed current flows to the load in a second direction opposite to the first direction.

Thus a bi-directional current circuit or source is provided that has fewer switches, takes up less board area, dissipates less power and costs less to manufacture than an H-bridge circuit.

These and other objects, features and advantages of the present invention are specifically set forth in or will become apparent from the following detailed description of a preferred embodiment of the invention when read in conjunction with the accompanying drawings.

DESCRIPTION OF THE PREFERRED EMBODIMENT

Figure 1:
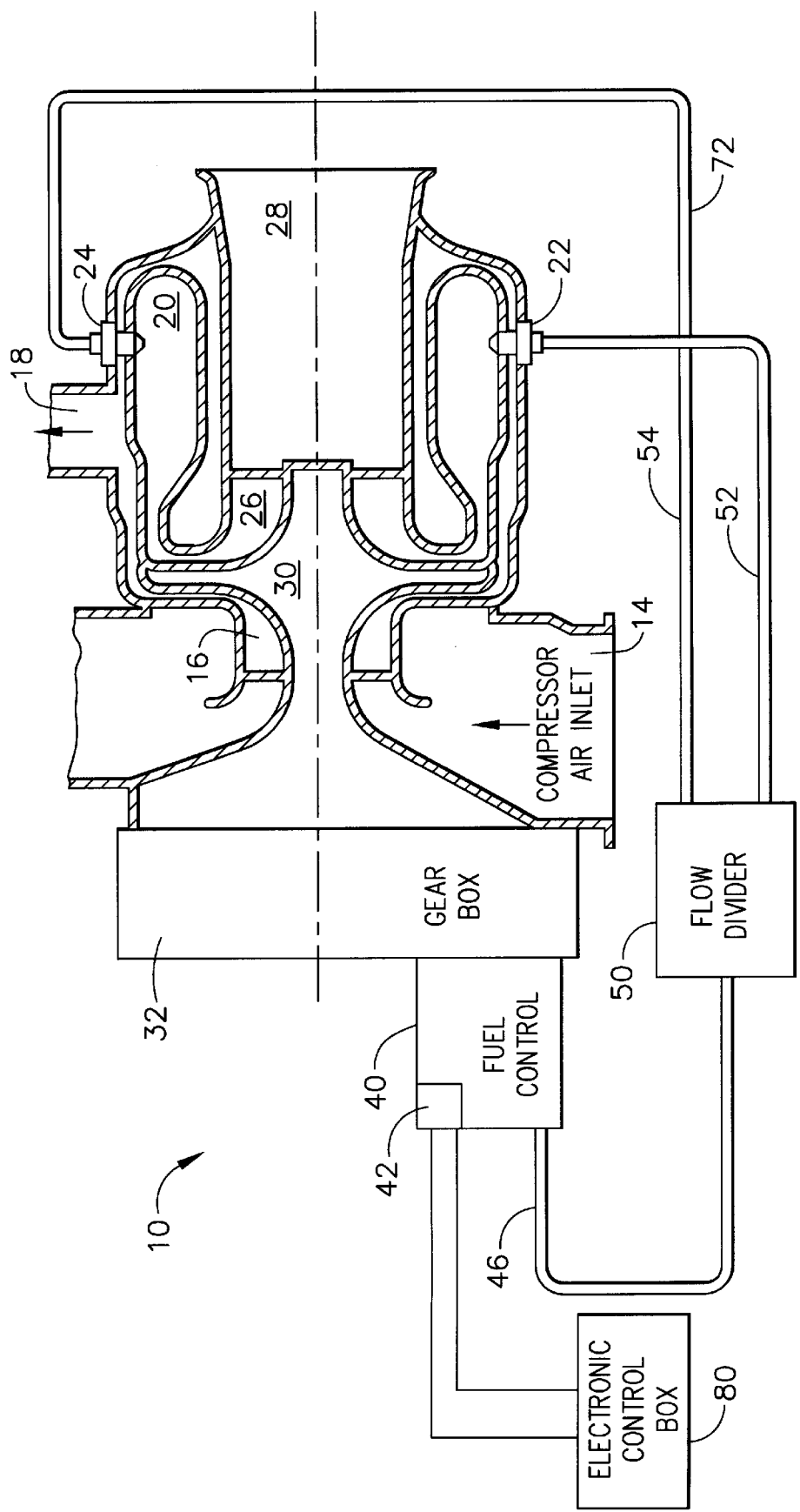
FIG. 1 is a schematic of a gas turbine engine referred to as an Auxiliary Power Unit.
Figure 3:
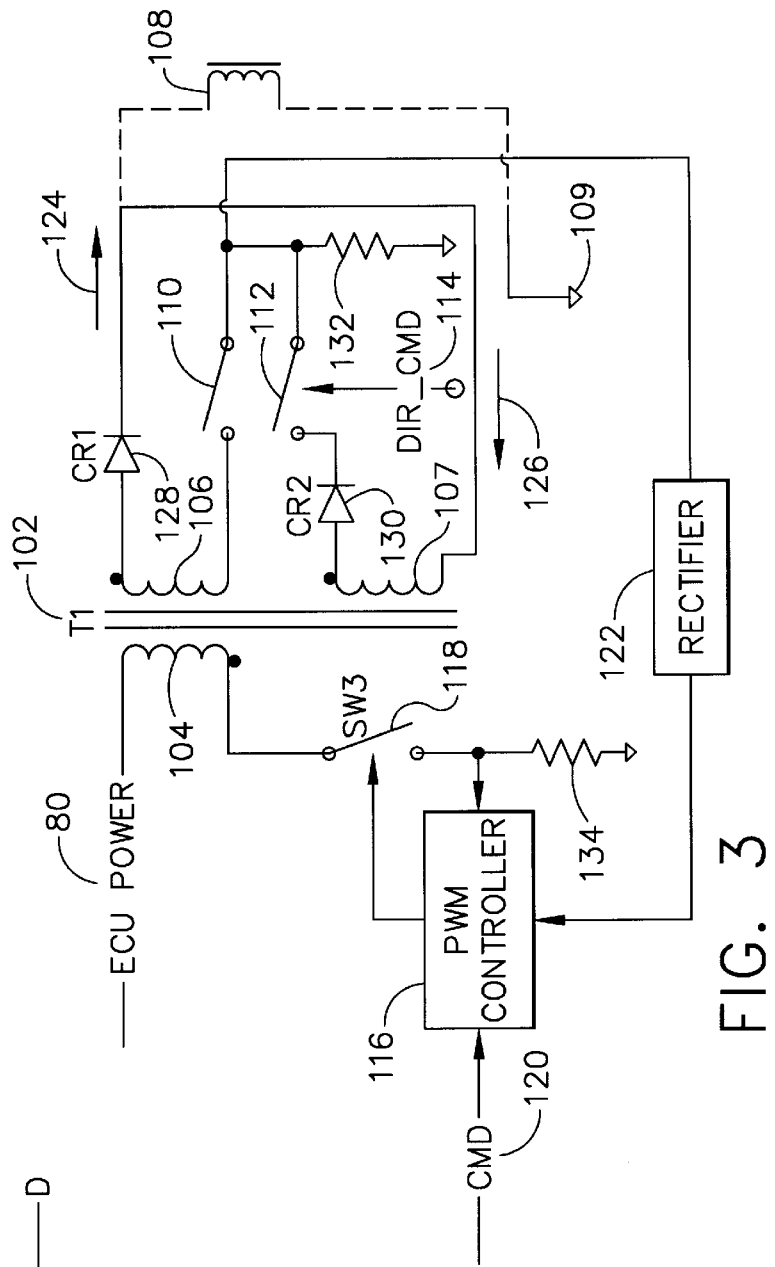
FIG. 3 is a circuit diagram of the bi-directional current source contemplated by the present invention.
Figure 2:
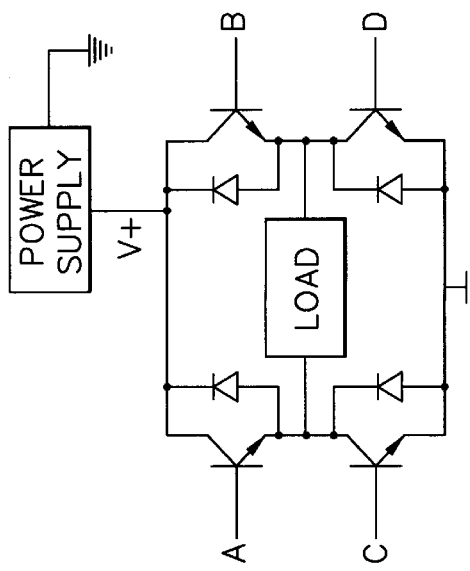
FIG. 2 is a prior art H-bridge amplifier circuit.

Referring to FIG. 3, a bi-directional current circuit is generally denoted by reference numeral 100. The circuit 100 includes a transformer 102 with a primary winding or input side 104 and secondary windings or output sides 106, 107. The primary winding 104 receives DC power from the ECU 80 and the secondary windings 106, 107 deliver DC power to the load 108 which may be the torque motor 42 or some other comparable device. Importantly, the transformer 102 converts a single power source into two power sources. It should be appreciated that this splitting of power can be accomplished by other electrical elements. The load 108 is grounded at 109. The direction of the current through the circuit 100 is controlled by switches 110 and 112 which act in a response to a digital command represented by arrow 114 from the ECU 80. A switch 118 couples a pulse width modulator controller 116 to the primary winding 104 of the transformer 102. The controller 116 receives a command 120 from the ECU 80 indicative of how much current should flow. A rectifier 122 is disposed between the switches 110, 112 and the controller 116. The rectifier 122, in a manner familiar to those skilled in the art, enables to circuit 100 to accommodate both negative and positive feedback. A resistor 134 is coupled to both the controller 116 and the switch 118 and causes the switch 118 to open in the event of an over current condition.

The switches 110 and 112 are each in series with the load 108. When switch 110 is closed and switch 112 is open, current flows through the secondary winding 106 and to the load 108 in a first direction represented by an arrow 124. In the case of the torque motor 42, the current will cause the motor to rotate in a first direction which results in the metering valve opening. When switch 112 is closed and switch 110 is opened, current flows through the secondary winding 107 and to the load 108 in a second direction represented by arrow 126, opposite from the first direction. This will cause the torque motor 42 to rotate in the opposite direction and the metering valve will close. There is no preferred correlation with the direction of the current and the opening and closing of the valve and the designer is free to arrange it either way.

The command signal 120 to the controller 116 can be a constant voltage which means constant current to the load 108. Preferably, the command signal is variable and the position of the torque motor will vary with the corresponding variable current. A rectifying diode 128 is disposed between switch 110 and the load 108 and a rectifying diode 130 between switch 112 and the load 108. The switches 110, 112 and 118 are conventional high speed electronic switches.

Thus, a bi-directional current circuit or source is provided that has fewer switches and other components when compared to an H-bridge circuit. As a result it takes up less board area, costs less to manufacture, and is more efficient.

It will be appreciated by those skilled in the art that various changes and modifications may be made to the illustrative embodiment without departing from the spirit or scope of the invention. For example, throughout the description reference as been made to a torque motor used in the fuel control of a gas turbine engines. This was done to provide an exemplary illustration of the invention, not to limit its applicability. The present invention can in fact be used in any application requiring bi-directional current. Therefore, it is intended that the scope of the invention not be limited in any way to the illustrative embodiment shown and described but that the invention be limited only by the claims appended hereto.

What is claimed is:

1. A bi-directional current circuit disposed between first and second output windings of a transformer comprising:
   a first switch connecting said first output winding to said load; and
   a second switch connecting said second output winding to said load,
   said first and second switches are arranged in series with said load so that when said first switch is closed and said second switch is open current flows to said load in a first direction and when said first switch is open said second switch is closed current flows to said load in a second direction opposite to said first direction.

2. The circuit of claim 1 further comprising a rectifier disposed between said first and second switches and an input winding of said transformer.

3. The circuit of claim 2 further comprising a pulse width modulator disposed between said rectifier and said input winding of said transformer.

4. The circuit of claim 3 further comprising a third switch disposed between said pulse width modulator and said input winding of said transformer.

5. The circuit of claim 4 further comprising a first diode disposed between said first switch and said load.

6. The circuit of claim 5 further comprising a second diode disposed between said second switch and said load.

7. The circuit of claim 6 further comprising a first resistor between said first and second switches and ground.

8. The circuit of claim 7 further comprising a second resistor disposed between said third switch and ground.

9. A bi-directional current circuit comprising:
   an electronic control unit;
   a load;
   a transformer having a primary winding receiving power from said electronic control unit and a plurality of secondary windings inductively coupled to said primary winding and connected to said load; and
   a first switch and a second switch each coupled in series between one of said plurality of secondary windings and said load, said first and second switches operating in response to a command from said electronic control unit whereby when said first switch is commanded closed and said second switch is commanded open current flows to said load in a first direction and when said first switch is commanded open and said second switch is commanded closed current flows to said load in a second direction opposite to said first direction.

10. The circuit of claim 9 further comprising a rectifier disposed between said first and second switches and said primary winding of said transformer.

11. The circuit of claim 10 further comprising a pulse width modulator disposed between said rectifier and said primary winding of said transformer.

12. The circuit of claim 11 wherein said pulse width modulator receives a constant voltage command from said electronic control unit and in response thereto said secondary winding provides a constant current to said load.

13. The circuit of claim 11 wherein said pulse width modulator receives a variable voltage command from said electronic control unit and in response thereto said secondary winding provides a variable current to said load.

14. The circuit of claim 11 further comprising a third switch disposed between said pulse width modulator and said primary winding of said transformer.

15. The circuit of claim 14 further comprising a first diode disposed between said first switch and said load.

16. The circuit of claim 15 further comprising a second diode disposed between said second switch and said load.

17. The circuit of claim 16 further comprising a first resistor between said first and second switches and ground.

18. The circuit of claim 17 further comprising a second resistor disposed between said third switch and ground.

19. A bi-directional current circuit, comprising:
   a transformer including a primary winding coupled to receive power from a power source and a plurality of secondary windings inductively coupled to said primary winding;
   a first controllable switch selectively coupling a first of said plurality of secondary windings to a load; and
   a second controllable switch selectively coupling a second of said plurality of secondary windings to said load,
   wherein said first and second controllable switches are each arranged in series with said load such that closing said first controllable switch and opening said second controllable switch causes current to flow from said first secondary winding to said load in a first direction, and opening said first controllable switch and closing said second controllable switch causes current to flow from said second secondary winding to said load in a second direction.

20. The circuit of claim 19, further comprising a third controllable switch selectively coupling said primary winding to said power source.

21. The circuit of claim 20, further comprising a first controller coupled to receive a feedback signal representative of a magnitude of the current flowing to said load.

22. The circuit of claim 21, wherein said third controllable switch selectively couples said primary winding to said power source in response to a command from said controller.

23. The circuit of claim 21, further comprising a rectifier coupled between said first and second controllable switches and said first controller, an output of said rectifier supplying the feedback signal to said first controller.

24. The circuit of claim 21, wherein said controller comprises a pulse width modulator controller circuit.

25. The circuit of claim 20, wherein said first and second controllable switches are opened and closed in response to a command from a second controller.

26. The circuit of claim 20, further comprising:

a first rectifier diode coupled in series between said first secondary winding and said first controllable switch; and a second rectifier diode coupled in series between said second secondary winding and said second controllable switch.

* * * * *

(12) EX PARTE REEXAMINATION CERTIFICATE (5117th)
United States Patent
Zappacosta, II

(10) Number: US 6,252,787 C1
(45) Certificate Issued: May 31, 2005

(54) CONTROLLABLE CIRCUIT FOR PROVIDING BI-DIRECTIONAL CURRENT TO A LOAD

(75) Inventor: Ernest E. Zappacosta, II, Tucson, AZ (US)

(73) Assignee: Honeywell International Inc., Morristown, NJ (US)

Reexamination Request:
No. 90/006,372, Sep. 3, 2002

Reexamination Certificate for:
Patent No.: 6,252,787
Issued: Jun. 26, 2001
Appl. No.: 09/569,561
Filed: May 12, 2000

(51) Int. Cl.$^7$ ............................................. H02M 7/217
(52) U.S. Cl. .......................... 363/89; 363/68; 363/21.04

(58) Field of Search ............................... 363/81, 84, 89, 363/67, 68, 20, 21.01, 21.04, 125

(56) References Cited

FOREIGN PATENT DOCUMENTS

EP          0 489 512 A2        6/1992

*Primary Examiner*—Bao Vu

(57) ABSTRACT

A bi-directional current circuit disposed between two power sources and a load. A first switch and a second switch each connect the load to one of the power sources respectively, whereby when the first switch is closed and the second switch is open current flows to the load in a first direction and when the first switch is open and the second switch is closed current flows to the load in a second direction opposite to the first direction.

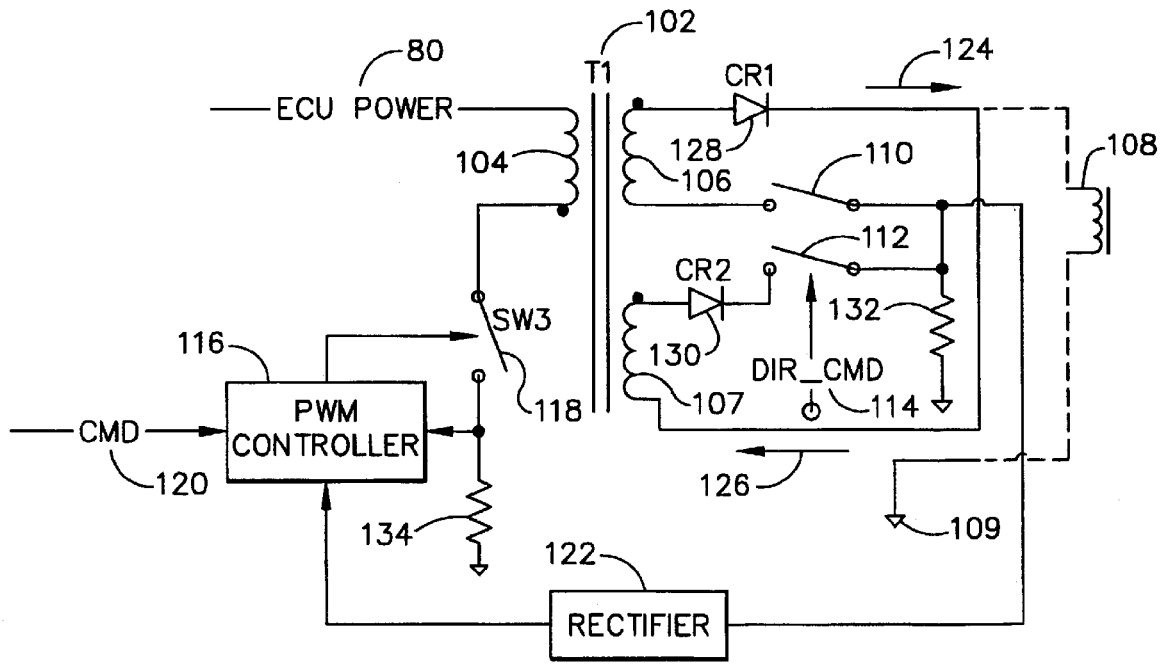

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 9–18 is confirmed.

Claims 2–8 and 26 are cancelled.

Claims 1 and 19 are determined to be patentable as amended.

Claims 20–25, dependent on an amended claim, are determined to be patentable.

1. A bi-directional current circuit disposed between first and second output windings of a transformer comprising:
   a first switch connecting said first output winding to said load; [and]
   a second switch connecting said second output winding to said load;
   *a rectifier disposed between said first and second switches and an input winding of said transformer;*
   *a pulse width modulator disposed between said rectifier and said input winding of said transformer;*
   *a third switch disposed between said pulse width modulator and said input winding of said transformer;*
   *a first diode disposed between said first switch and said load;*
   *a second diode disposed between said second switch and said load;*
   *a first resistor between said first and second switches and ground; and*
   *a second resistor disposed between said third switch and ground,*
   said first and second switches are arranged in series with said load so that when said first switch is closed and said second switch is open current flows to said load in a first direction and when said first switch is open said second switch is closed current flows to said load in a second direction opposite to said first direction.

19. A bi-directional current circuit, comprising:
    a transformer including a primary winding coupled to receive power from a power source and a plurality of secondary windings inductively coupled to said primary winding;
    a first controllable switch selectively coupling a first of said plurality of secondary windings to a load; [and]
    a second controllable switch selectively coupling a second of said plurality of secondary windings to said load;
    *a first rectifier diode coupled in series between said first secondary winding and said first controllable switch; and*
    *a second rectifier diode coupled in series between said second secondary winding and said second controllable switch,*
    wherein said first and second controllable switches are each arranged in series with said load such that closing said first controllable switch and opening said second controllable switch causes current to flow from said first secondary winding to said load in a first direction, and opening said first controllable switch and closing said second controllable switch causes current to flow from said second secondary winding to said load in a second direction.

* * * * *